(12) United States Patent
Mandel et al.

(10) Patent No.: US 7,920,961 B2
(45) Date of Patent: Apr. 5, 2011

(54) METHOD AND APPARATUS FOR PATH PLANNING AND DISTANCE CALCULATION

(75) Inventors: Alexander Mandel, Bruchsal (DE); Jan Kappallo, Reilingen (DE); Wassili Sabelfeld, Koenigs Wusterhausen (DE); Christian Reinhardt, Mannheim (DE); Markus Puchta, Regensburg (DE)

(73) Assignee: SAP AG, Walldorf (DE)

(*) Notice: Subject to any disclaimer, the term of this patent is extended or adjusted under 35 U.S.C. 154(b) by 821 days.

(21) Appl. No.: 11/847,166

(22) Filed: Aug. 29, 2007

(65) Prior Publication Data

US 2009/0063035 A1    Mar. 5, 2009

(51) Int. Cl.
*G08G 9/00* (2006.01)

(52) U.S. Cl. .......... 701/200; 701/300; 700/99; 700/112; 700/302; 700/303

(58) Field of Classification Search .................. 700/214, 700/228, 99, 112, 302, 303; 701/200, 300
See application file for complete search history.

(56) References Cited

U.S. PATENT DOCUMENTS

| | | | | |
|---|---|---|---|---|
| 3,705,410 A | * | 12/1972 | Kooy et al. | 705/8 |
| 4,415,975 A | * | 11/1983 | Burt | 414/273 |
| 5,056,437 A | * | 10/1991 | Maddock | 104/88.03 |
| 5,111,401 A | * | 5/1992 | Everett et al. | 701/24 |
| 5,521,837 A | * | 5/1996 | Frankle et al. | 716/10 |
| 6,338,021 B1 | * | 1/2002 | Yagyu et al. | 701/209 |
| 6,622,085 B1 | * | 9/2003 | Amita et al. | 701/208 |
| 6,876,958 B1 | | 4/2005 | Chowdhury et al. | |
| 7,706,918 B2 | * | 4/2010 | Sato et al. | 700/245 |
| 2001/0047242 A1 | | 11/2001 | Ohta | |
| 2006/0195226 A1 | * | 8/2006 | Matsukawa et al. | 700/245 |
| 2007/0136079 A1 | | 6/2007 | Beykirch et al. | |
| 2007/0219667 A1 | | 9/2007 | Jung et al. | |

OTHER PUBLICATIONS

Minimum spanning tree—Wikipedia, the free encyclopedia. http://en.wikipedia.org/w/index.php?title=Minimum_spanning_tree&oldid=375473117&printable=yes. Downloaded: Aug. 28, 2010.*
Dijkstra's algorithm—Wikipedia, the free encyclopedia. http://en.wikipedia.org/w/index.php?title=Dijkstra%27s_algorithm&oldid=380489297&printable=yes. Downloaded: Aug. 28, 2010.*

* cited by examiner

*Primary Examiner* — Mark Hellner
*Assistant Examiner* — Ari M Diacou
(74) *Attorney, Agent, or Firm* — Blakely, Sokoloff, Taylor & Zafman, LLP

(57) ABSTRACT

Methods and apparatuses enable generation of a managed space layout model defining permissible pathways for travel through the managed space. Each permissible pathway can be defined as a line segment or an edge bounded by coordinate pairs. Items and locations within the managed space are associated with permissible pathways, which association defines how the items/locations can be reached via travel through the managed space. The information can be saved as a network of nodes, which defines the intersection of the permissible pathways and includes information about the pathways. With the layout model, a path can be determined through the managed space to accomplish work in the managed space. The layout data allows a path distance to be calculated for a given work task that involves travel through the managed space.

26 Claims, 4 Drawing Sheets

METHOD AND APPARATUS FOR PATH PLANNING AND DISTANCE CALCULATION

FIELD

Embodiments of the invention relate to planning a path to accomplish work in an area, and more particularly to path planning and distance calculation based on permissible pathways in a managed space.

BACKGROUND

Path planning is generally performed to determine a travel path for a worker or machine (e.g., a semi-autonomous robot) through an area (e.g., a warehouse, a hospital, etc.). The area through which travel is planned may be referred to as a managed space. A planned path can be calculated based on data describing or defining the managed space. Traditional methods of path planning have determined where obstacles (e.g., walls, support structures, machines, fixtures, storage bins, etc.) are within the managed space, and tried to identify a path that avoids the obstacles. Such methods of path planning are very computationally expensive, and often do not provide the types of results wanted by a planner. For example, a planner may want to determine a distance of the calculated path, which is not necessarily possible with traditional systems.

SUMMARY

Methods and apparatuses enable path determination in a managed space (e.g., a warehouse) based on a layout model defining permissible pathways. The permissible pathways define discrete areas of the managed space where travel through the managed space is permissible. The layout model may define the permissible pathways through a network of nodes, which indicates where in the managed space permissible pathways start and stop, and where the pathways intersect with other pathways. When a request to perform a task requiring travel through the managed space to a specified location is received, a planning system can generate a path from a starting location to the specified location based on the layout model.

In one embodiment, items within the managed space can be associated with permissible pathways based on the coordinates of the item, and the coordinates of the pathway. When a path is generated for travel through the managed space, generally a shortest path is desired. In one embodiment, a shortest path is determined from heuristics. The heuristics can be applied in the form of path determination algorithms, such as a depth first search or a breadth first search. Other heuristics algorithms could be applied. In one embodiment, a combination of algorithms is employed. In addition to applying heuristic algorithms, the path determination may be affected by application-specific data, such as information about a specific resource (e.g., a particular forklift) to use for the task.

In one embodiment, a functionality check is performed by determining the completeness of the layout model. Completeness of the layout model may include determining whether travel is possible between each node of the network, or determining whether every item or location within the managed space can be reached with the model. In one embodiment, a path distance calculation is performed that may be used for purposes of planning (e.g., determining how long a task should take) and/or evaluation (e.g., determining whether the task was completed within an expected amount of time).

Methods and apparatuses enable layout generation to create a network of nodes for a layout model. Layout generation may include obtaining master data that defines the managed space, including indicating coordinates of items within the managed space, obstacles (e.g., walls, doors), work stations, etc. Thus, a grid representation of the managed space indicates what areas of the managed space are occupied. Then, rather than defining a planning model for the managed space in terms of the obstacles, the system can then determine what areas are not occupied and define permissible pathways to traverse the managed space. The permissible pathways are represented as line segments bounded by a pair of coordinates of the grid representation, which have an associated length. The system identifies intersections of the permissible pathways (e.g., overlap of the line segments), and generates a network of nodes for the managed space based on the intersections of the permissible pathways. Each node represents an intersection. The network of nodes is saved as a model for path planning for travel through the managed space. Based on the permissible pathway information, a travel distance can be calculated for a planned path through the managed space. The travel distance is based at least partially on the lengths associated with the permissible pathways.

In one embodiment, additional information is provided or determined and stored with the layout model. For example, each permissible pathway can have associated travel constraints. For example, pathways may be restricted based on a width of the path and a size of the resource. Thus, resources of a size incompatible with a particular pathway are not permitted to traverse the managed space via the particular pathway. As another example, permissible pathways may be defined as having a direction of travel. Thus, the pathway may only be traveled in one direction (similar to a one-way street). As another example, a pathway may have an associated resource type of resource class, where travel on the pathway is not permitted by other resources.

In one embodiment, a functionality check is performed to determine completeness of the network of nodes prior to saving the network of nodes as a model. For purposes of testing, in one embodiment, the network of nodes is connected to another network of nodes by a pathway that is not present within the networks individually. Thus, the system can perform a completeness check on multiple separate networks simultaneously. Errors can be pinpointed to a network of origin.

BRIEF DESCRIPTION OF THE DRAWINGS

The following description includes discussion of figures having illustrations given by way of example of implementations of embodiments of the invention. The drawings should be understood by way of example, and not by way of limitation. As used herein, references to one or more "embodiments" are to be understood as describing a particular feature, structure, or characteristic included in at least one implementation of the invention. Thus, phrases such as "in one embodiment" or "in an alternate embodiment" appearing herein describe various embodiments and implementations of the invention, and do not necessarily all refer to the same embodiment. However, they are also not necessarily mutually exclusive.

Figure 1:
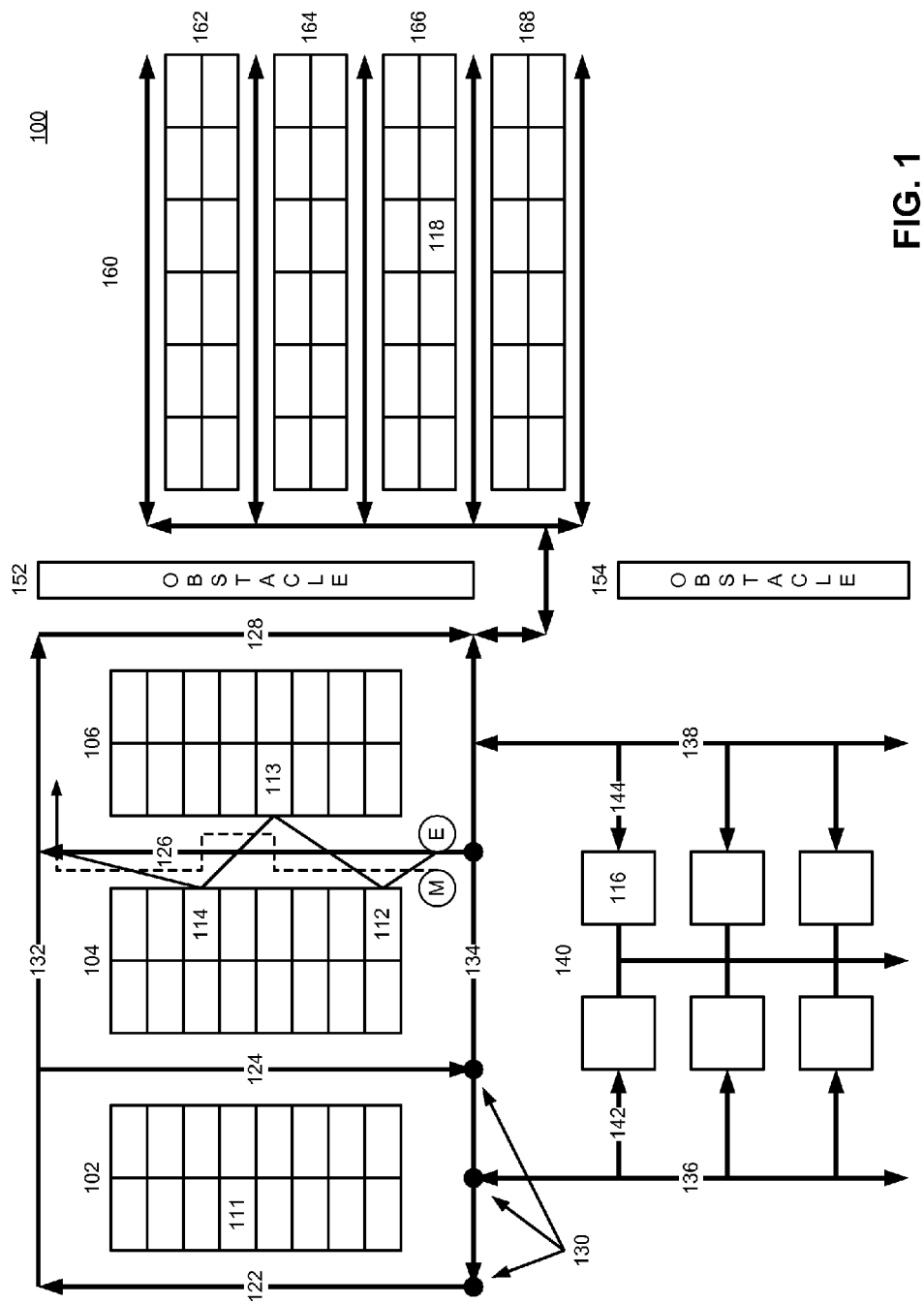
FIG. 1 is a block diagram of an embodiment of a system having areas where work tasks are performed and permissible pathways for traveling to the work areas.

Descriptions of certain details and implementations follow, including a description of the figures, which may depict some or all of the embodiments described below, as well as discussing other potential embodiments or implementations of the inventive concepts presented herein. An overview of embodiments of the invention is provided below, followed by a more detailed description with reference to the drawings.

DETAILED DESCRIPTION

A managed space is modeled as a network to determine a path through the managed space. The network is a network of nodes that defines intersections of permissible pathways in the managed space. Instead of defining the managed space in terms of obstacles (where a path cannot be), the managed space is defined in terms of permissible pathways (the areas where a path can be). The definition of permissible pathways reduces the computational overhead in determining a path for a given task. Additionally, determining a path with a managed space definition based on permissible pathways allows for increased flexibility in defining the pathway, which results in increased efficiency in the management of the managed space. One significant improvement is the ability to calculate a path distance, allowing the management of the managed space to account for expected distances and corresponding expected times to complete tasks.

The permissible pathways define discrete areas of the managed space where travel through the managed space is possible and permitted. Travel is possible where a pathway exists. The type of travel possible on any given pathway can be further defined with parameters that can add constraints on how travel can be accomplished on the given pathway. For example, a pathway may have an associated or corresponding width, direction of travel (e.g., a one-way path), be split into right and left lanes (e.g., in wider paths, or through wide doorways), be restricted to access by a certain resource type (e.g., some equipment is permitted and others are not due to size or weight), etc. Any of a number of constraint parameters can be created and associated with the pathways.

Areas of work (e.g., a picking station or a staging area) and items within the managed space (e.g., a bin for part XYZ001, a container for carrying parts to be gathered (picked), etc.) are associated with particular coordinates in the managed space. Each item or area of work, based on its coordinates, can be associated with a particular pathway. Thus, path determination can be first made to the associated pathway, and then to the specific location on the associated pathway where the item or area will be found. When a request to perform a task at a specified location requires moving from a starting location to the specified location, travel can be planned based on the layout model.

Generally a shortest path from the starting point to the specified location is desired. However, path planning may take a different route for any of a variety of reasons, which are implementation specific. When searching for a "best" path (e.g., shortest), heuristics are generally employed. Example heuristics algorithms include a depth first search or a breadth first search. A depth first search followed by a bounded breadth first search could also be employed. Any combination of known heuristics may be applied to the layout model to determine a path for travel through the managed space. Resource information specific to the task may also be factored into the heuristic algorithm. Examples of resource information may include a particular forklift, a specific robot, a particular cart to use, etc. Other information could also be factored in, such as a known condition (disability) of a worker that will perform the task, whether other workers are expected to be within the managed space at the same time, etc.

In one embodiment, a functionality check is performed by determining the completeness of the layout model. The functionality check may generally be performed on a network of nodes prior to saving/storing the network as a model. However, a functionality check can be performed in conjunction with path planning to determine whether a path is possible through the managed space. Thus, a functionality check can be performed as part of the generation of the layout model and/or in conjunction with generation of a path from a layout model. Completeness or consistency of the layout model refers to whether it is possible to travel from each node (e.g., every intersection of an edge, or every start/end of edge) to every other node. Where pathway direction and usable resource type information is specified, the functionality check will take into account the settings or parameters of the edges with respect to such information. In one embodiment, a functionality check is performed in reference to a particular resource to use for a given process. Thus, the system can verify, for example, that each storage bin the in network can be reached from any other storage bin by any pathway using the given resource type. A passing functionality check may be that every bin or location in the managed space is reachable at least through one valid path.

In one embodiment, a path distance calculation is performed that may be used for purposes of planning (e.g., determining how long a task should take) and/or evaluation (e.g., determining whether the task was completed within an expected amount of time). Many processes or tasks within a warehouse would be benefited from a management perspective by knowing the distance between two locations (e.g., between storage bins) or knowing the total travel distance related to a warehouse order (e.g., picking order, travel path from the starting point via the different picking bins to the staging area, etc.). Path distance calculation is based on the length of each permissible pathway traveled between the starting point to the destination point.

Determining the shortest travel distance in a warehouse may include evaluating the possible ways from one bin to another, or from one storage type to another. As discussed above, the layout model includes a network of nodes of possible and/or permissible pathways. Such a model can be considered to be similar to a city map, where the permissible pathways are comparable to streets on the map. The permissible pathways will generally correspond, for example, to aisles in a rack storage, walkways, etc. A shortest travel distance plans for travel across a possible path composed of permissible pathways that have shorter lengths than permissible pathways that make up a different possible path.

The layout model can be generated from master data of the managed space, which generally indicates x-y coordinates of the storage bins or other items, and associated storage types. In a permissible pathway approach, the start and end bins of an aisle can be identified (to determine the length of the aisle), and an edge or line segment is generated that passes all storage bins in the aisle. A connection to the next aisle can be established with an additional edge. The length of these edges can be determined based on the master data (e.g., x-y coordinates) derived from the storage bins. The result of such a generation routine is a set of edges defining the network, where each edge is a permissible pathway.

As mentioned above, heuristics may be used to calculate a best route or path through the managed space. In one embodiment, a combination of heuristics is used. For example, the system may first employ a fast depth first search to find a first feasible solution (allowed path). The first feasible solution can be modified by a breadth first search to find improvements of the initial solution (such as a shortest path). In one embodiment, a stopping criterion is provided to limit the breadth first search to a given number of nodes that the path visits relative to the number of nodes of the first feasible solution. A stopping criterion could also be applied to a depth first search to limit the search to a given number of nodes. However, based on the nature of a depth first search, the application of a stopping criterion may not provide any significant benefit. A stopping criterion can be understood as a trigger to stop when a threshold number is reached. Such a criterion limits the computational intensity of the path determination, and can be employed, for example, if system determination performance is relevant.

In addition to such heuristics, in one embodiment, additional metrics can be used in path determination calculations. Such metrics may include determining whether to employ a Euclidean or Manhattan distance calculation. A Euclidean distance calculation considers the path between two points to be a "straight line," which is a hypotenuse edge of a right triangle formed between the coordinates of a starting point and a stopping point. The starting and stopping points may be an edge to a picking location, for example. All such segments can be added up to determine a total distance. A Manhattan distance calculation considers the path between two points to occur in two segments, one along an x-axis, and the other along the y-axis between the coordinates of the starting and stopping point. Thus, all travel in a Manhattan distance calculation is considered to occur at right angles. In one embodiment, a layout model may fail to provide a valid network, in which case the system may default to calculating the direct distance between two points in the managed space based on a user-selected metric (e.g., Euclidean or Manhattan). In one embodiment, the application of the Manhattan and/or Euclidean calculation metrics can be considered a modification to distances of the line segments.

In one embodiment, a planning algorithm is applied to the layout model to perform distance calculation for defining an engineered labor standard (ELS). An ELS is used to calculate the amount of time expected for a worker to complete a given task or process. The ELS can be defined to include the distances needed to be traveled.

In contrast to traditional systems, as described herein, a network of nodes can be automatically generated based on storage bin master data and storage type master data. Storage bin sort sequence as defined for each activity area can be included in a travel distance calculation. The system can perform a distance calculation based on knowledge of a resting point, or temporary location of a resource (even after work breaks), to generate a distance calculation with a close approximation to the real working situation. Thus, in one embodiment, the system determines a starting location prior to generating a path. The starting point determination may determine based on time of day or end point of a previous task where a resource is expected to be, and thus determine the starting point for the next task.

FIG. 1 is a block diagram of an embodiment of a system having areas where work tasks are performed and permissible pathways for traveling to the work areas. System 100 represents a warehouse layout, which is one example of a managed space as described herein. The various blocks of system 100 represent items that may be within a warehouse. Each is an example, and other layouts are possible. Note that while system 100 is described in reference to a warehouse, and the description is compatible with the structure of a warehouse, the various areas described could just as easily be locations within a store, a hospital, or some other managed space where path planning may be used.

Storage racks 102, 104, and 106 represent racks as may be found in a warehouse. A storage rack may contain large items that can each be placed on a location on a shelf. Such items may be (relatively) large in and of themselves (e.g., an engine block, a sofa, a refrigerator, a ceiling fan) or may be a package or box of smaller items bundled together (e.g., a case of screws, a package of door handles, a pallet of books). What is on storage racks 102-106 not significant; rather, the point of storage racks 102-106 is that there are aisles formed by the racks, and there are items at various individual locations of the racks.

In one embodiment, system 100 also includes work station area 140, with various locations to perform work. For example, location 116 may represent a packing station where various items picked from within system 100 are packaged together for sending to a customer, or transferring to another location with the same company.

System 100 is also shown with obstacles 152-154, which may represent, for example, walls. Other obstacles may be present in the layout of system 100 that are not explicitly called out in the figure. In one embodiment, system 100 includes storage bin area 160, which includes storage bin shelves 162-168 to store smaller items than what might normally be found in a rack storage. Smaller items may include anything from individual bolts to cables to manuals, etc.

System 100 provides a graphical example of a warehouse layout. Such information could be stored as computer-readable data. Such data may be referred to as master data, which indicates where (x-y coordinates) everything in the warehouse is on a grid. The assignment of the grid is arbitrary, and can be assigned by a system manager. The creation of master data is known in the art and will not be further explained here.

From the master data or some equivalent data that describes the locations of every item in the warehouse, a planning system of a warehouse management system can generate a model to be used in path calculation for the warehouse. As described herein, the planning system analyzes the master data and generates permissible pathways from the data. An example of generated permissible pathways is illustrated with the dark bold lines in FIG. 1.

Beginning with storage racks 102-106, each pathway within the storage rack area is shown assigned as a permissible pathway. Specifically, pathways 122-128 are illustrated as pathways oriented in a "vertical" direction. Note that as discussed above, the grid representation of the warehouse is arbitrary, as is a designation of "horizontal" or "vertical" directions. For purposes of simplicity in description, horizontal and vertical directions will be consistent with the natural orientation of FIG. 1, as will "left" and "right" and "up" and "down." Thus, pathways 122-128 are vertical, and pathways 132-134 are horizontal for purposes of discussion herein. Pathways 122-128 and 132 are one-way pathways, as indicated by having an arrow at only one end of the line segments representing the pathways. Pathway 134 is a bidirectional pathway, as indicated by having arrows at both ends.

The assignment of the pathways as unidirectional or bidirectional can be arbitrarily assigned for purposes of warehouse process flow control. There may or may not be anything inherently unidirectional about a pathway assigned as a unidirectional pathway. One example of an arbitrary assignment is to assign a walkway as a unidirectional pathway to keep all travel moving in the same direction. One example of an assignment constrained by inherent characteristics of the pathway may include the assignment of an escalator as a unidirectional pathway.

For planning, the warehouse management system can automatically generate permissible pathways from the master data, and then plan a path based on the resulting permissible pathways. For example, to perform work (e.g., picking an item) at location 111 in storage rack 102, the system may plan a path from a starting point to pathway 134, and then plan for travel to the left to pathway 122, then up pathway 122 to location 111, then continuing to pathway 132, right on pathway 132 and continue to another location for another task. The warehouse management system may be able to determine and assign the path based on nodes, which may be the end points of a pathway (which may also be referred to as an edge or line segment) and/or intersections of two pathways. Thus, nodes 130 represent some of the nodes in system 100. Based on the examples of nodes 130, it will be understood from FIG. 1 where the other nodes of the system would be. The management system can generate an entire network of nodes, with pathway information linking the nodes. Such pathway information may include, for example, the length and size of the pathway between the two nodes, and the direction of permissible travel between the nodes.

Pathway 126 is intersected by two example paths. Suppose a warehouse process involved travel up pathway 126 to pick materials at locations 112, 113, and 114. The travel up pathway 126 would begin at the node representing the intersection of pathways 126 and 134. Two types of paths may be considered for travel plan and/or distance calculation purposes. The dashed path is the M, or Manhattan, path, while the solid path is the E, or Euclidean, path. The Manhattan path passes location 112 in a true vertical (hereinafter "vertical") line, followed by a 90 degree right turn and a true horizontal (hereinafter "horizontal") line to location 113. From location 113, the Manhattan path turns left 90 degrees and travels vertically, followed by a turning left 90 degrees and a traveling horizontally to location 114. The path then continues until travel begins on pathway 132.

The Euclidean path takes a direct (rather than segmented, 90-degree hops) route to location 112, followed by a direct path to location 113 and location 114. Note that from a computational standpoint, the Manhattan calculation is generally simpler, seeing that the Euclidean path requires the Manhattan calculations plus additional computations. In one embodiment, a combination of Manhattan and Euclidean metrics are used to calculate paths.

In area 140, the permissible pathways used to arrive to the various work stations depends upon which workstation is needed. The assigned layout for work station area 140 includes incoming paths (e.g., pathways 142 and 144) to the work stations from the sides (pathways 136 and 138). Paths outgoing from the work stations, for example, to a staging area (not shown), go out from the middle of the work stations. Thus, the work station at location 116 may be reached by traversing pathway 134 to pathway 138 to pathway 144.

To reach area 160, travel is required between obstacles 152 and 154. Note that in traditional path planning systems, the system only considers obstacles. Thus, the logic would require knowing where the obstacles are, and trying to route a path around or between them. As described with reference to system 100, there is a permissible pathway defined between obstacles 152 and 154. Thus, travel simply requires traversing the permissible pathways. The system does not need to consider obstacles in path planning once the model is generated. The model defines the permissible pathways. Thus, travel to location 118 would involve travel via the permissible pathways traveling around the obstacles to the vertical pathway of location 160, and finally via the pathway between bin storage shelves 166 and 168.

Although FIG. 1 is not intended to be drawn to scale, the spacing between the shelves of area 160 and the spacing between racks 102-104 is intentionally made different. Other spacing is arbitrary. The spacing differences between racks 102-104 and the shelves of area 160 is intended to illustrate what is mentioned above with respect to resource-specific path planning. For example, there may be some resources that are too large to traverse the pathways between the shelves of area 160. Thus, a permissible pathway cannot be found for that particular resource if a task must be performed at a location within area 160. Such considerations can be determined by the management system based on data indicating resources and path size, for example.

Figure 2:
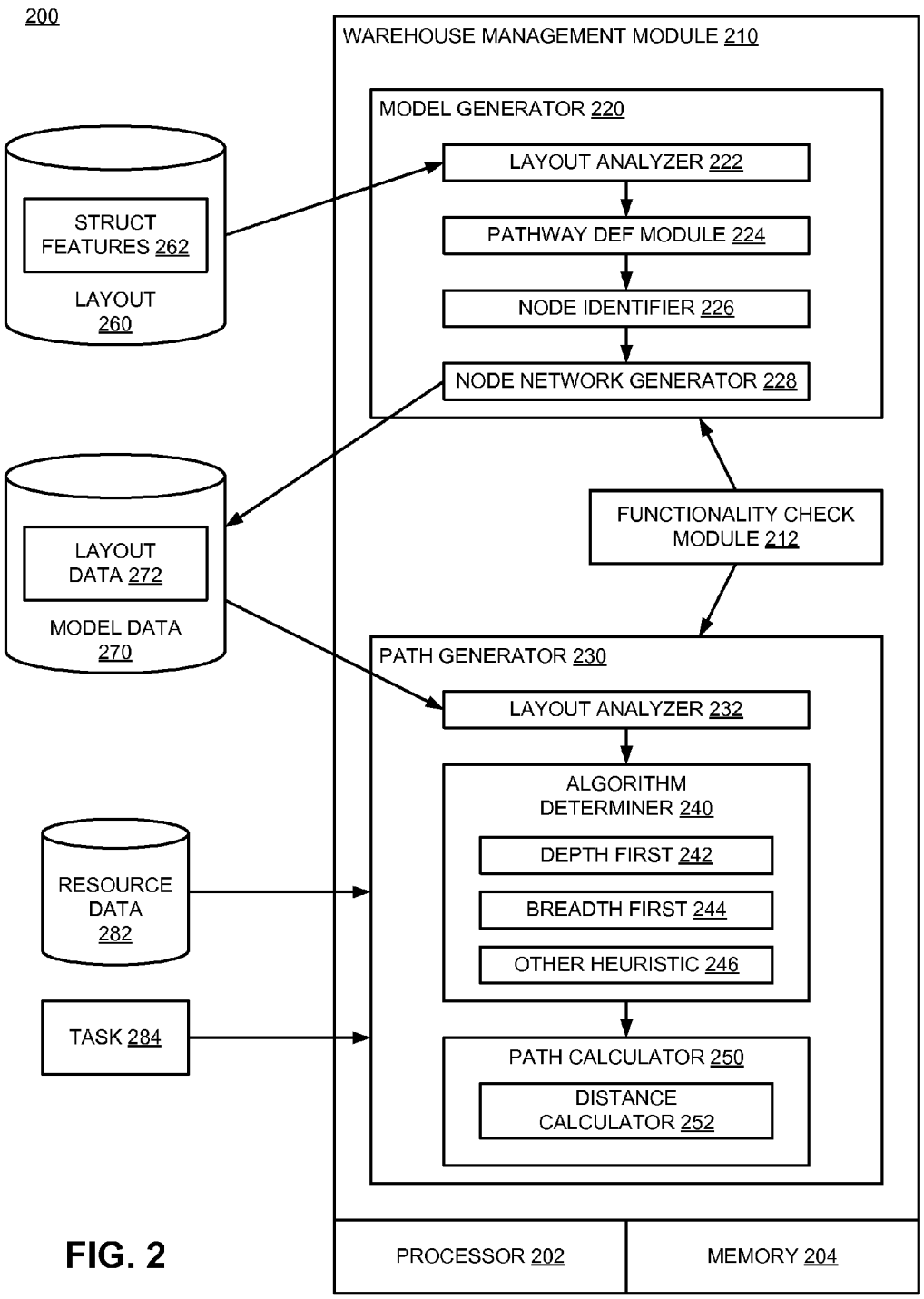
FIG. 2 is a block diagram of an embodiment of a warehouse management system having a warehouse model generator

FIG. 2 is a block diagram of an embodiment of a warehouse management system having a warehouse model generator that defines a network of nodes that indicates permissible pathways and a path generator that define a path based on the network or nodes. System 200 represents a hardware and functional system with which layout model generation and path planning can be performed. System 200 includes warehouse management module 210, which executes on processor 202 and memory 204. Processor 202 represents one or more hardware resources that provide the functionality of warehouse management module 210. Processor 202 may be any type of processing resource, including a standalone microcontroller or microprocessor system, a central processing unit (CPU) of a system server, etc. In one embodiment, processor 202 is an application specific integrated circuit (ASIC) or other programmable chip programmed with firmware that implements the functionality of warehouse management module 210. Thus, the functionality may be implemented in hardware in certain implementations. Memory 204 includes any type of memory for storing code, instructions, and data. Such memory may be any one or combination of technologies, including random access memory (RAM) technologies and/or flash memory.

Warehouse management module 210 may be a part of a warehouse management system. In one embodiment, warehouse management module 210 is the warehouse management system. In one embodiment, warehouse management module 210 includes model generator 220 and path generator 230. Model generator 220 and path generator 230 could be part of separate systems, as there is no requirement for them to be part of the same warehouse management system. There may be separate management systems for the separate (model generation and path planning) management functions. Generators 220 and 230 may be implemented on separate hardware, and may even be implemented by separate business entities. Alternatively, they could be combined together.

In one embodiment, model generator 220 includes layout analyzer 222, pathway definition (def) module 224, node identifier 226, and node network generator 228. Other functionality modules could be present in other implementations. In other implementations, certain functionality modules may be combined. Layout analyzer 222 enables model generator 220 to receive layout 260 and process the layout data to generate a model of a managed space. Layout 260 may be stored in a storage system of system 200, such as a backend enterprise system. Layout 260 includes structural (struct) features 262, which indicate coordinates of the various structural features of the managed space. Layout 260 includes coordinate information on the various items and work spaces available within the managed space. Layout 260 may be, for example, master data related to a warehouse or other managed space. Layout 260 may include information indicating direction of travel on particular pathways, size of pathways, etc. Additionally, or alternatively, such information can be inputted into warehouse management module by a user to modify identified pathways.

Pathway definition module 224 enables model generator 220 to identify and define pathways from the layout data. Layout analyzer 222 may pass its analysis to pathway definition module 224. Layout analyzer 222 may thus identify the structures and pathways of layout 260, and then pass the information to pathway definition module 224 to define permissible pathways based on the information. Permissible pathways in a model may include all pathways for any resource type.

The pathway information can be provided to node identifier 226. Note that in one embodiment, node identifier 226 would receive the layout analysis to define where there are nodes in the layout, and generate pathways based on where the nodes are. The two functions may be performed concurrently. In one embodiment, node identifier 226 identifies nodes based on determining where pathways exist. The end points of each pathway or path segment in the layout can be defined as nodes. The length of the pathway is considered to be the distance between the two nodes. In one embodiment, node identifier 226 identifies nodes based on determining where pathways intersect. The intersections can be defined as nodes. In certain implementations, there may be very little distinction between determining where endpoints of pathways exist and determining where pathways intersect.

Node network generator 228 stores the nodes with the information regarding pathways and pathway restrictions as a model. The nodes are organized as a network, which can indicate what relationship each node has with others (e.g., which nodes are connected to which other nodes). The network of nodes contains the information necessary to plan paths, including information to determine where the nodes are within a grid representing the managed space, where the permissible pathways exist, and information that indicates how the permissible pathways may be traversed (e.g., what resources can be used on them, etc.). The network of nodes is stored as a model in model data 270. Model data 270 can exist in the same or a different storage system from which layout 260 was obtained. Model data 270 includes layout data 272, which indicates the variety of information necessary to plan paths.

In one embodiment, path generator 230 is triggered by task 284 to begin operation to generate a path. For example, task 284 may be generated within system 200, which task requires travel through the managed space. In conjunction with creation of the task or in response to creation of the task, system 200 may cause path generator 230 to generate a path for the task. Resource data 282 represents data that describes various resources for performing tasks, one or more of which may be assigned in task 284. Thus, path generator 230 may determine from resource data 282 one or more features of a resource indicated in task 284, and generate a path that accounts for such information.

In one embodiment, path generator 230 includes layout analyzer 232, algorithm determiner 240, and path calculator 250. Layout analyzer 232 obtains or receives model data 270, which includes layout data 272 with the information necessary about the layout of the managed space to be able to plan paths for tasks in the managed space. The layout data defines permissible pathways used to plan the paths for the tasks. Layout analyzer 232 obtains layout data 270 and processes it to determine where there are permissible paths in the managed space. Layout analyzer 232 may simply identify information that is passed to a path calculator to perform a path determination.

Algorithm determiner 240 provides the ability for path generator 230 to utilize one or more heuristic algorithms to determine a path. Note that the algorithms are considered heuristics, because determining a truly ideal path may be impractical or impossible. Thus, algorithm determiner 240 provides options that provide a solution that is optimum within a given set of conditions or parameters. For example, a certain algorithm may be executed until a particular bound or threshold is reached. The threshold may be an amount of time, a number of execution cycles, a number of nodes considered, etc. Combinations of algorithms may be used, as discussed previously. Example heuristic algorithms include depth first search 242 and breadth first search 244. Other heuristic 246 represents any other type of algorithm that may be employed to determine a best path for the layout and resource information being analyzed.

Path calculator 250 receives layout analysis data and applies a selected algorithm, or a selected heuristic approach (e.g., a combination of algorithms) to determine a path for the task. Path calculator 250 identifies a possible solution, and improves the solution to a best solution within given thresholds. In one embodiment, path calculator 250 includes distance calculator 252, which determines an actual travel distance for the determined path. The travel distance is based on the length of the line segments associated with the selected path for the task. Such information, as described above, can be used for ELS determination or other planning purposes. Distance calculator 252 may employ a Manhattan or Euclidean metric, or a combination.

Various components referred to herein as modules, clients, engines, or agents described herein may be a means for performing the functions described. Each component described herein includes software or hardware, or a combination of these. The components can be implemented as software modules, hardware modules, special-purpose hardware (e.g., application specific hardware, application specific integrated circuits (ASICs), digital signal processors (DSPs), etc.), embedded controllers, hardwired circuitry, etc. Software content (e.g., data, instructions, configuration) may be provided via an article of manufacture including a machine readable medium, which provides content that represents instructions that can be executed. The content may result in a machine performing various functions/operations described herein. A machine readable medium includes any mechanism that provides (i.e., stores and/or transmits) information in a form accessible by a machine (e.g., computing device, electronic system, etc.), such as recordable/non-recordable media (e.g., read only memory (ROM), random access memory (RAM), magnetic disk storage media, optical storage media, flash memory devices, etc.). The content may be directly executable ("object" or "executable" form), source code, or difference code ("delta" or "patch" code). A machine readable medium may also include a storage or database from which content can be downloaded. A machine readable medium may also include a device or product having content stored thereon at a time of sale or delivery. Thus, delivering a device with stored content, or offering content for download over a communication medium may be understood as providing an article of manufacture with such content described herein.

Figure 3:
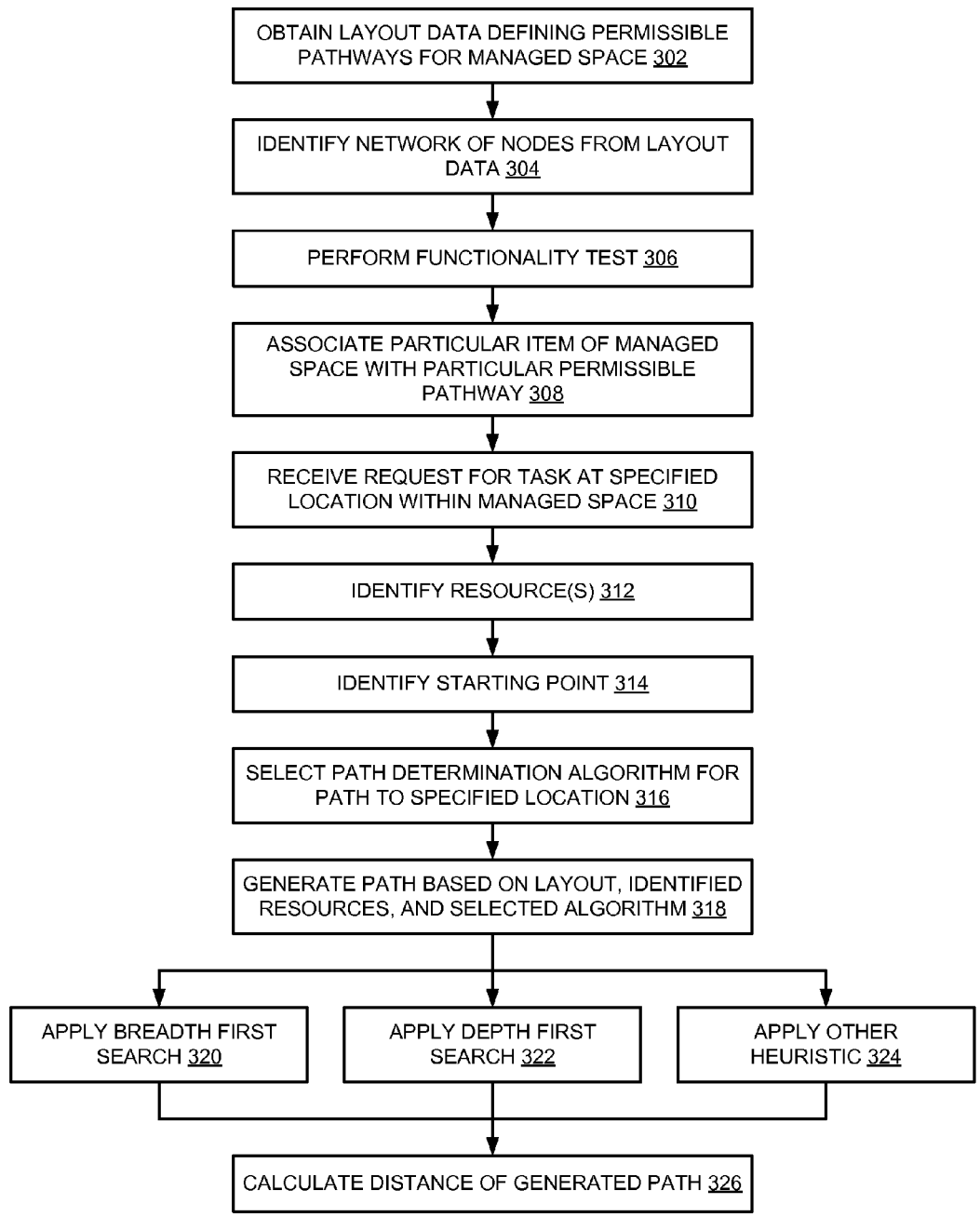
FIG. 3 is a flow diagram of an embodiment of a process for generating a path to a work area based on a model that defines permissible pathways of a managed space.

FIG. 3 is a flow diagram of an embodiment of a process for generating a path to a work area based on a model that defines permissible pathways of a managed space. Flow diagrams as illustrated herein provide examples of sequences of various process actions. Although shown in a particular sequence or order, unless otherwise specified, the order of the actions can be modified. Thus, the illustrated implementations should be understood only as examples, and the illustrated processes can be performed in a different order, and some actions may be performed in parallel. Additionally, one or more actions can be omitted in various embodiments of the invention; thus, not all actions are required in every implementation. Other process flows are possible.

A management system obtains layout data that defines permissible pathways for a managed space, 302. The layout data may include a network of nodes with parameters defining relationships between the nodes. In one embodiment, the relationships between the nodes define the permissible pathways and may provide information about each pathway. The management system identifies the network of nodes from the layout data, 304. The system can then determine from the layout data where there are permissible pathways in the managed space. The management system can also determine from the layout data where items are in the managed space. In one embodiment, the management system performs a functionality test, 306, to determine whether the layout data includes a permissible pathway to every location with the managed space.

In one embodiment, the management system associates a particular item of the managed space with a particular permissible pathway, 308. Determining a path to the particular item in the managed space can then be determined based on generating a path to the permissible pathway. More particularly, the management system can determine a location along the permissible pathway where the item can be found. The system can generate a path to the permissible pathway, and more particularly to the determined location.

The management system receives a request for a task at a specified location within the managed space, 310. The specified location may be the location associated with the particular item, or for example, with a particular work area. The management system can generate a path to the specified location to accomplish the task. In one embodiment, the management system identifies one or more resources, 312, to use to perform the task. To generate a path to the specified location, the management system identifies a starting point or starting location of the path, 314. The starting location may be determined based on an ending location of a previous task, or a storage or resting location of an identified resource.

To determine the path, the management system selects a path determination algorithm to generate a path to the specified location, 316. Based on a starting point, the management system can generate a path based on the layout data and the identified resources applying the selected algorithm, 318. In one embodiment, the management system applies a breadth first search, 320. In one embodiment, the management system applies a depth first search, 322. In one embodiment, the management system applies a combination of breadth first and depth first searches. In one embodiment, the management system applies some other heuristic, 324.

The result of the heuristic output is a path to the specified location. In one embodiment, the management system calculates a distance of the generated path, 326. The calculated distance can be used in planning and evaluation.

Figure 4:
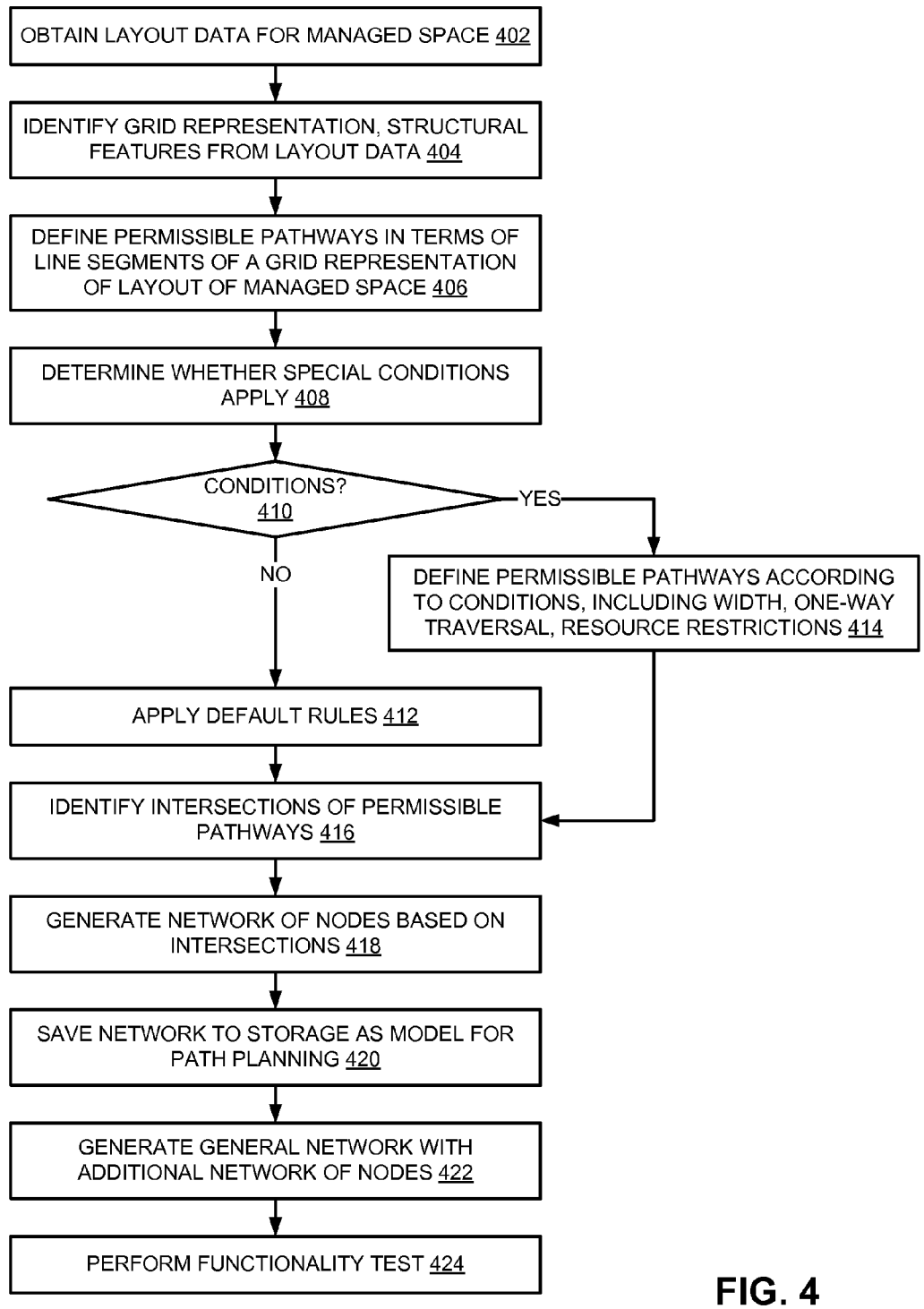
FIG. 4 is a flow diagram of an embodiment of a process for generating a model of a managed space that defines permissible pathways.

FIG. 4 is a flow diagram of an embodiment of a process for generating a model of a managed space that defines permissible pathways. In one embodiment, a management system obtains layout data for a managed space, 402. The layout data includes information identifying coordinates or locations for every item and every structural feature of the managed space. Based on the layout data, the management system identifies a grid representation of the managed space and the structural features of the managed space, 404.

The managed system defines permissible pathways in terms of line segments of the grid representation of the layout of the managed space, 406. Thus, particular sections of the layout are defined as areas where travel through the managed space is permitted. The management system can determine whether special conditions should apply to any of the permissible pathways, 408. If special conditions should apply, 410, the management system can apply such special conditions. For example, the management system can define permissible pathways according to constraint conditions including path size, one-way traversal, and/or resource restrictions, 412. Path size, for example, may be how wide a pathway is. Width defines a width for the permissible pathway. One-way traversal defines a permissible pathway as unidirectional. Resource restrictions places restrictions on what resources can be used on a particular pathway. In one embodiment, a resource restriction may place a time-based restriction on a resource, such as not allowing the resource on the particular pathway at certain times.

If no conditions are to be applied, 410, the management system may apply default rules to the pathways, 412. Whether special conditions or default rules, the management system defines rules with the pathways and identifies intersections of the permissible pathways, 416. Identifying intersections may be the same as, or similar to, defining endpoints of the permissible pathways. Based on the definitions of the permissible pathways, the management system generates a network of nodes based on the intersections, 418. The nodes may be each intersection or endpoint. The management system saves or stores the network of nodes to a storage system as a model for path planning, 420.

The management system optionally generates a general network by associating the saved network of nodes with another network of nodes. That is, the management system may generate a pathway to link the two networks and thus generate a general network with the additional network of nodes, 422. Note that the linking pathway does not need to exist as an actual pathway, it may simply be generated as a testing tool. In one embodiment, the management system performs a functionality test, 424. The functionality test determines the validity of the network of nodes (e.g., to verify that all locations are reachable by at least one pathway from every other location. If the management system linked the network of nodes with in a general network configuration, the functionality test could test functionality for all linked networks simultaneously.

Besides what is described herein, various modifications may be made to the disclosed embodiments and implementations of the invention without departing from their scope. Therefore, the illustrations and examples herein should be construed in an illustrative, and not a restrictive sense. The scope of the invention should be measured solely by reference to the claims that follow.

What is claimed is:

1. A warehouse management system comprising:
   a model generator to define a layout model of an area of a warehouse and save the model to a storage system, the model generator having
      a layout analyzer to receive layout data for the area, the layout data including a grid representation of the area with structural features of the area indicated by coordinates on the grid;

a pathway definition module to define edges in the area, each edge representing a permissible pathway indicating where travel through the area is permissible, the edges being line segments bounded by a pair of coordinates; and a node network generator to generate a network of nodes for the area where each node represents an end of each edge; and a path generator to generate a path from the layout model for a task within the area, the path generator having a layout analyzer to receive the layout model and identify a starting location and a task location within the area; and a path calculator to generate a path from the starting location to the task location based on the edges defined within the layout model.

2. The method of claim 1, wherein to generate the path from the starting location to the target location comprises:
associating the task location with a particular permissible pathway of the model.

3. The system of claim 1, wherein the system performs a functionality check to determine that complete congruity exists among the nodes of the network, prior to generating the path.

4. The system of claim 1, wherein the system calculates the distance of the generated path, based on distance information for each permissible pathway traversed in the generated path.

5. The system of claim 1, wherein the path calculator further comprises:
a distance calculator to calculate a travel distance for the task.

6. The system of claim 1, further comprising:
a functionality check module coupled to the path calculator to determine whether the layout model includes a permissible path from the starting location to the task location for a resource specified to execute the task.

7. The system of claim 1, wherein to generate the path to the task location further comprises:
restricting the path based on the width and a size of a resource, where a path is defined that only traverses permissible pathways compatible in width with the size of the resource.

8. The system of claim 1, wherein to generate the path from the starting location to the task location comprises:
generating a shortest path.

9. The system of claim 8, wherein to generate the path from the starting location to the task location further comprises:
determining the shortest path for a given system resource, the system resource having one or more limitations on travel through the managed space based on size or movement capability.

10. The system of claim 8, wherein to generate the path from the starting location to the task location further comprises:
calculating the shortest path by applying one or more of a depth first search algorithm or a breadth first search algorithm to the network.

11. The system of claim 10, wherein applying one or more of the depth first search algorithm or the breadth first search algorithm comprises:
applying the depth first search algorithm up to a stopping criterion of a certain number of nodes of the network to generate a first feasible solution; and then
applying the breadth first search algorithm to the network to refine the first feasible solution.

12. The system of claim 10, wherein applying one or more of the depth first search algorithm or the breadth first search algorithm comprises:
applying the depth first search algorithm to generate a first feasible solution; and then
applying the breadth first search algorithm up to a stopping criterion of a certain number of nodes of the network to refine the first feasible solution.

13. An article of manufacture comprising a machine readable medium having content stored thereon to provide instructions to cause a machine to perform operations including:
obtaining layout data for a managed space, the layout data including a grid representation of the managed space and structural features of the managed space indicated by coordinates on the grid;
defining edges that represent permissible pathways for the managed space based on the layout data, the permissible pathways indicating areas of the managed space where travel through the managed space is permissible, the edges being line segments bounded by a pair of coordinates;
generating a network of nodes for the managed space where each node represents an end of each edge; and
saving the network of nodes to a storage system as a model for path planning for the managed space.

14. The article of manufacture of claim 13, wherein the content to provide instructions for defining the edges further comprises content to provide instructions for
defining each aisle of a warehouse as an edge, and each end of each aisle is represented by a node of the network of nodes.

15. The article of manufacture of claim 13, wherein the content further provides instructions to cause the machine to perform operations including:
perform a distance calculation on the network of nodes for a specified process that requires travel through the managed space; and
defining an engineered labor standard based at least in part on an expected time to perform the travel of the calculated distance through the managed space.

16. The article of manufacture of claim 13, further comprises content to provide instructions for:
generating a path for a specified resource, including performing a functionality test on the network of nodes to determine whether a path exists between a starting location and an identified location for the specified resource.

17. The article of manufacture of claim 16, wherein the content to provide instructions for generating the path for the specified resource from the starting location to the identified location further comprises content to provide instructions for determining the starting location.

18. The article of manufacture of claim 16, wherein the content further provides instructions to cause the machine to perform operations including:
performing a distance calculation on the generated path.

19. The article of manufacture of claim 18, wherein the content to provide instructions for performing the distance calculation further comprises content to provide instructions for
applying a depth first search algorithm up to a stopping criterion of a certain number of nodes of the network to generate a feasible solution.

20. The article of manufacture of claim 18, wherein the content to provide instructions for performing the distance calculation further comprises content to provide instructions for applying a user-selected distance calculation metric selected from the group consisting of a Manhattan distance calculation metric and a Euclidean distance calculation metric.

21. A computer-implemented method comprising:

obtaining layout data for a managed space, the layout data including a grid representation of the managed space and structural features of the managed space indicated by coordinates on the grid;

defining permissible pathways for the managed space based on the layout data, the permissible pathways indicating areas of the managed space where travel through the managed space is permissible, the permissible pathways represented as line segments bounded by a pair of coordinates;

identifying every intersection of permissible pathways with each other;

generating a network of nodes for the managed space based on identifying the intersections, each node representing an intersection of permissible pathways; and saving the network of nodes to a storage system as a model for path planning for the managed space.

22. The method of claim 21, wherein defining the permissible pathways comprises:

defining permissible pathways as line segments bounded by a pair of grid coordinates, each permissible pathway having an individual associated size.

23. The method of claim 21, wherein defining the permissible pathways comprises:

defining a permissible pathway as a line segment bounded by a pair of grid coordinates and a direction of travel from one of the coordinates to the other, where travel in the reverse direction is impermissible.

24. The method of claim 21, wherein defining the permissible pathways comprises:

defining a permissible pathway as a line segment bounded by a pair of grid coordinates and a permissible resource-type, where traversal by a different resource type is impermissible.

25. The method of claim 21, further comprising:

generating a general network by coupling the network of nodes together with another network of nodes by at least one pathway not present within either network individually; and saving the general network to the storage system as a model for concurrently testing the two networks.

26. The method of claim 21, further comprising:

performing a functionality check to determine that complete congruity exists among the nodes of the network, prior to saving the network of nodes.

* * * * *